United States Patent
Casey et al.

(10) Patent No.: US 6,866,544 B1
(45) Date of Patent: Mar. 15, 2005

(54) METHODS AND APPARATUS FOR MOUNTING AN ELECTROMAGNETIC INTERFERENCE SHIELDING CAGE TO A CIRCUIT BOARD

(75) Inventors: Kevin Casey, Cary, NC (US); Kurt Kordes, Pleasanton, CA (US); Steven Fleming, Santa Cruz, CA (US); Robert Gregory Twiss, Chapel Hill, NC (US); M. Onder Cap, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 26 days.

(21) Appl. No.: 10/396,854

(22) Filed: Mar. 25, 2003

(51) Int. Cl.[7] ............................................. H01R 13/648
(52) U.S. Cl. ........................................ 439/607; 439/79
(58) Field of Search ................... 439/79, 607

(56) References Cited

U.S. PATENT DOCUMENTS

| | | | |
|---|---|---|---|
| 6,407,932 B1 | 6/2002 | Gaio et al. | 361/818 |
| 6,508,670 B1 | 1/2003 | Hwang | 439/607 |
| D481,356 S | * 10/2003 | Hwang | D13/123 |
| D481,677 S | * 11/2003 | Hwang | D13/123 |
| 6,666,694 B1 | * 12/2003 | Daly et al. | 439/79 |
| 6,729,905 B1 | * 5/2004 | Hwang | 439/607 |
| 2004/0077217 A1 | * 4/2004 | Hwang | 439/607 |

OTHER PUBLICATIONS

Small Form Factor Pluggable (SFP), http://ireland.methode.com/New/new.htm, last updated May 27, 2002, visited Jan. 24, 2003, 1 page.

New XENPAK 10 Gb Ethernet Standard, http://www.xenpak.org/, visited Jan. 24, 2003, 1 page.

Small Form Factor Pluggable (SFP) Cage, http://ireland.methode.com/New/DM7034.htm, visited Jan. 24, 2003, 1 page.

* cited by examiner

*Primary Examiner*—Hae Moon Hyeon
(74) *Attorney, Agent, or Firm*—Chapin & Huang, L.L.C.; David E. Huang, Esq.

(57) ABSTRACT

An EMI shield, or module cage, mounts to a circuit board such that a first portion of the module cage extends above a first planar surface of the circuit board and a second portion of the module cage extends below a second planar surface of the circuit board. The module cage surrounds a corresponding transceiver module and allows airflow to travel across the transceiver module and through the module cage in a direction substantially perpendicular to a planar surface of the circuit board to cool the transceiver module. In one arrangement, multiple module cages attach to the circuit board in a modular configuration. Such a configuration allows attachment, to the circuit board, of the number of module cages corresponding to the number of transceiver modules required or utilized by the circuit board.

30 Claims, 11 Drawing Sheets

METHODS AND APPARATUS FOR MOUNTING AN ELECTROMAGNETIC INTERFERENCE SHIELDING CAGE TO A CIRCUIT BOARD

BACKGROUND OF THE INVENTION

Conventional computerized devices, such as computers communicating over a data communication network, utilize transceivers or modules to both receive and transmit data. For example, computerized devices use optical transceivers to send and receive data in cases where the data communications network requires transmission of the data at relatively high rates of speed. Typical optical transceivers convert light pulses into electrical signals (e.g., for signals received from the network) or convert electrical signals into light pulses (e.g., for signals transmitted to the network).

The optical transceivers are normally mounted on a surface of a host printed circuit board (PCB) such as an input/output printed circuit card or a port card connected to an input/output card. In order to facilitate the connection of a fiber-optic cable to the optical transceiver, the transceiver is usually located on a periphery of the host printed circuit board.

During operation, conventional computerized devices generate arid emit electromagnetic radiation. In a phenomenon known as electromagnetic interference (EMI), such electromagnetic radiation can affect the function of other electronic devices in the vicinity of the computerized device. EMI shielding devices help reduce emitted electromagnetic radiation from radiation sources. EMI shields also help protect electronic devices against electromagnetic radiation emissions from the radiation source. Conventional EMI shields typically cover a substantial portion of the associated electronic devices and are usually formed of a metal material that, when grounded, attenuates or redirects the EMI radiation.

With respect to transceivers, such as optical transceivers, EMI emissions that radiate from within a computerized device affect the performance or function of such transceiver modules. To minimize the computerized device's EMI emissions from adversely affecting (e.g., interfering with operation of) the transceiver modules, a conventional transceiver module circuit board has a shielding cage mounted to a surface of the circuit board to cover the transceiver module and reduce the amount of electromagnetic radiation received by the module. In such a conventional configuration, one surface of the shielding cage contacts a planar surface of the circuit board. Furthermore, the shielding cage is typically grounded to the host circuit board, such as through a ground plane formed as part of the circuit board.

SUMMARY

Conventional techniques for positioning and mounting transceiver module EMI cages to a circuit board suffer from a variety of deficiencies.

As described above, conventional transceiver module EMI cages mount to a surface of the circuit board. In such a configuration, one surface of the shielding cage contacts a planar surface of the circuit board. In such a mounting configuration, however, the circuit board acts as an insulator that limits or prevents heat from traveling through the cage along the surface of the cage contacting the circuit board. Such blockage limits the amount of heat dissipated from the transceiver module contained within the shielding cage. Heat buildup for a transceiver module, such as an optical transceiver module, can cause the module to operate improperly or malfunction.

The conventional shielding cage mounting configuration also affects the spacing between adjacent circuit boards. For example, conventional computer systems have a card cage, or chassis, and a back plane mounted to the card cage configured to provide connection of the circuit boards to the computer system. The card cage holds multiple circuit boards where the planar surfaces of the circuit boards are substantially parallel and where the surface of each circuit board is located at a distance from the surface of an adjoining circuit board. The spacing between the circuit boards is influenced by the height of the shielding cages and transceivers. A relatively large height of the shielding cage relative to the mounting surface of the circuit board requires a relatively large distance between adjacently mounted circuit boards to accommodate for the height of the shielding cage. In turn, increasing the distance between adjacently mounted circuit boards (e.g., to accommodate the height of the shielding cages and transceivers), reduces the number of circuit boards that fit within a mounting space (e.g., within the card cage).

One conventional solution to mounting adjacent circuit boards within a card cage with relatively narrow distances or spacings between the circuit board involves mounting a transceiver to the circuit board such that a top portion of the transceiver extends above a top surface of the circuit board and a bottom portion of the transceiver extends below a bottom portion of the circuit board. In such a configuration, such as the XENPAK 10 Gb transceiver, each XENPAK transceiver rests within a notch and on support rails, as defined by the circuit board, where each transceiver has its own corresponding set of support rails. Typically, the rails are approximately 0.25 inches wide to accommodate the XENPAK transceivers. For multiple transceivers in such a configuration, however, multiple rails utilize a relatively large amount of circuit board real estate.

Furthermore, manufacturers of circuit boards typically mount a number of EMI shielding cages to the circuit board corresponding to the maximum transceiver requirements of the circuit board. For example, if a circuit board is configured to utilize a maximum of four separate transceiver modules, the manufacturer mounts four separate EMI cages to the circuit board. Such a configuration allows a manufacturer to produce a "one-size-fits-all" circuit board, regardless of the transceiver requirements for a particular circuit board. In certain cases, however, all of the shielding cages are not utilized. For example, the four transceiver-space circuit board can be configured with only two transceiver modules, thereby leaving two shielding cages unused. In such a case, the end user of the circuit board effectively pays for unused EMI shielding cages.

By contrast to the use of prior EMI shielding cages and transceiver mounting configurations, embodiments of the present invention significantly overcome such deficiencies. The present invention relates to an EMI shield, or module cage, oriented within a plane of a circuit board such that a first portion of the module cage extends above a first planar surface of the circuit board and a second portion of the module cage extends below a second planar surface of the circuit board. The module cage surrounds a transceiver module and allows airflow to travel across the transceiver module and through the module cage in a direction substantially perpendicular to a planar surface of the circuit board. Such a configuration aids in cooling of the transceiver module. Also, for a circuit board configured to utilize multiple transceiver modules, multiple module cages attach to the circuit board in a modular configuration. Such a configuration allows attachment, to the circuit board, of the number of module cages corresponding to the number of transceiver modules used by the circuit board (e.g., a circuit board configured to utilize up to four transceiver modules but having only two transceiver modules attached to the circuit board would use only two module cages, one for each transceiver module). Such a configuration minimizes the cost of the circuit board by eliminating attachment of unused module cages from the circuit board.

In one arrangement, a circuit board assembly has a circuit board defining a first surface, a second surface opposing the first surface, a boundary, and a slot along a portion of the boundary, the slot configured to receive a transceiver module. The circuit board assembly also has a module cage coupled to the circuit board. The module cage positions within the slot defined by the circuit board and surrounds at least a portion of the transceiver module. The module cage has a first housing portion extending past the first surface of the circuit board and a second housing portion extending past the second surface of the circuit board where the module cage is configured to provide electromagnetic interference shielding for the transceiver module. Such positioning of the module cage relative to the circuit board (e.g., lowering the module cage into the circuit board), reduces a height of the module cage relative to the first surface of the circuit board, thereby allowing insertion of the circuit board into relatively narrow vertical spacings, compared to conventional circuit boards having surface attached EMI shielding cages. Furthermore, reducing the height of the module cage relative to the first surface of the circuit board provides additional "headroom" above the module cages, compared to conventional circuit boards, thereby allowing for attachment of a heat sink to the module cage to provide additional cooling to the transceiver module.

In one arrangement, the module cage defines a first ventilation opening in the first housing portion and a second ventilation opening in the second housing portion where the first ventilation opening and the second ventilation opening are configured to allow air flow through the module cage in a direction substantially perpendicular to the first surface and second surface of the circuit board. Orientation of the module cage relative to the circuit board in the above-described configuration, along with the ventilation openings, allow air to travel across the transceiver module and through the module cage in a direction substantially perpendicular to a planar surface of the circuit board. Such airflow aids in cooling the transceiver module thereby minimizing a possibility of malfunction of the transceiver caused by overheating.

In one arrangement, the module cage defines at least one connection pin and the circuit board defines at least one plated through hole that extends from the first surface to the second surface of the circuit board. The circuit board has a conductive ground-plane with the plated through hole being in electrical communication with the conductive ground plane and an electrical fastener that fastens the at least one connection pin of the module cage to the at least one plated through hole to couple the module cage to the circuit board. Such a configuration provides grounding of the module cage to the to the ground plane of the circuit board without the use of any additional hardware, thereby reducing the cost of manufacture of the circuit board.

In one arrangement, the circuit board assembly has a module connector electrically coupled to the circuit board and aligned with the slot defined by the circuit board. The second housing portion of the module cage defines a module connector opening configured to engage the module connector and the module cage has a module connector covering configured to attach to the module cage to cover the module connector opening. The module cage and module connector covering are configured to provide electromagnetic interference shielding for the transceiver module. In such a configuration the module connector covering and the module cage isolates EMI radiation exposure of a corresponding transceiver module at the module level (e.g., a single module cage and module connector covering isolates a single transceiver module).

In one arrangement, the module connector is a small form factor pluggable (SFP) connector. In another arrangement, the module connector is a 10 gigabit small form factor pluggable (XFP) connector. The circuit board and module cage design allow for multiple (e.g., different) connector types having different pin densities to be connected to the circuit board.

In one arrangement, the circuit board assembly has a module cage carrier coupled to the circuit board and coupled to the module cage. The module cage carrier is configured to position the module cage within the slot defined by the circuit board such that the first portion of the module cage extends past the first surface of the circuit board and the second portion of the module cage extends past the second surface of the circuit board. The module cage carrier and the module cage configured to provide electromagnetic interference shielding for the transceiver module. Such positioning of the module cage relative to the circuit board (e.g., lowering the module cage into the circuit board) by the module cage carrier reduces a height of the module cage relative to the first surface of the circuit board. Such positioning of the module cage, by the module cage carrier, allows insertion of the circuit board into relatively narrow vertical spacings, compared to conventional circuit boards having surface attached EMI shielding cages.

In one arrangement, the module cage carrier defines at least one connection pin and the circuit board has a conductive ground-plane, at least one plated through hole that extends from the first surface to the second surface of the circuit board, the plated through hole being in electrical communication with the conductive ground plane, and an electrical fastener that fastens the at least one connection pin of the module cage carrier to the at least one plated through hole to couple the module cage carrier to the circuit board. Such a configuration provides grounding of the module cage carrier to the to the ground plane of the circuit board without the use of any additional hardware, thereby reducing the cost of manufacture of the circuit board.

In one arrangement, the slot is configured to receive two or more module cages and the module cage carrier is configured for attachment of two or more module cages to the module cage carrier. Such a configuration minimizes the amount of real estate of the circuit board used to couple multiple transceivers to the circuit board, compared to the XENPAK transceiver mounting configuration utilizing multiple rails to support the XENPAK transceivers.

Such a configuration of the slot and module cage carrier also allows for selective population of the circuit board with module cages, thereby providing a cost savings during manufacture of the circuit board. Typically, module cage materials and manufacturing costs are higher than module cage carrier materials and manufacturing costs (e.g., relatively intricate module cages formed from tin-plated beryllium copper material cost more than relatively less intricate module cage carriers formed from cold-rolled steel). Use of the module cage carrier allows attachment of module cages to the circuit board on an as-needed or as-required basis, compared to the conventional approach of fully populating a circuit board with module cages (e.g., potentially over-populating the circuit board with unused module cages), regardless of the system requirements. Such selective population, therefore, reduces the manufacturing cost of the circuit board.

In one arrangement, the circuit board assembly has a module connector electrically coupled to the circuit board and aligned with the slot defined by the circuit board. The second housing portion of the module cage defines a module connector opening configured to engage the module connector and the module cage has a module connector covering configured to attach to the module cage to cover the module connector opening and to engage the module cage carrier. The module cage, module connector covering, and module cage carrier are configured to provide electromagnetic interference shielding for the transceiver module. In such a configuration the module connector covering and the module cage isolates EMI radiation exposure of a corresponding transceiver module at the module level (e.g., a single module cage and module connector covering isolates a single transceiver module).

In one arrangement, the circuit board assembly has a support mount coupled to the circuit board assembly where the support mount has a support plate attached to the circuit board and oriented substantially parallel to the second surface of the circuit board, the support plate having a first electromagnetic interference shielding connection, a face plate in communication with the support plate, the face plate configured to engage the module cage and provide access to the transceiver module, and a second electromagnetic interference shielding connection in communication with the face plate and oriented substantially parallel to the first surface of the circuit board. The support mount provides both EMI radiation shielding to the transceiver modules connected to the circuit board and EMI radiation shielding to the circuit board as a whole.

The present invention also relates to a method for assembling a circuit board assembly. In one arrangement, a user forms a circuit board defining a first surface, a second surface opposing the first surface, a boundary, and a slot along a portion of the boundary, the slot configured to receive a transceiver module. The user then couples a module cage to the circuit board, the module cage positioned within the slot defined by the circuit board and surrounding at least a portion of the transceiver module, the module cage having a first housing portion extending past the first surface of the circuit board and a second housing portion extending past the second surface of the circuit board, the module cage configured to provide electromagnetic interference shielding for the transceiver module.

The features of the invention, as described above, may be employed in electronic equipment and methods such as those of Cisco Systems of San Jose, Calif.

BRIEF DESCRIPTION OF THE DRAWINGS

The foregoing and other objects, features and advantages of the invention will be apparent from the following more particular description of embodiments of the invention, as illustrated in the accompanying drawings and figures in which like reference characters refer to the same parts throughout the different views. The drawings are not necessarily to scale, with emphasis instead being placed upon illustrating the embodiments, principles and concepts of the invention.

DETAILED DESCRIPTION

The present invention relates to an EMI shield, or module cage, oriented within a plane of a circuit board such that a first portion of the module cage extends above a first planar surface of the circuit board and a second portion of the module cage extends below a second planar surface of the circuit board. The module cage surrounds a transceiver module and allows airflow to travel across the transceiver module and through the module cage in .a direction substantially perpendicular to a planar surface of the circuit board. Such a configuration aids in cooling of the transceiver module. Also, for a circuit board configured to utilize multiple transceiver modules, multiple module cages attach to the circuit board in a modular configuration. Such a configuration allows attachment, to the circuit board, of the number of module cages corresponding to the number of transceiver modules used by the circuit board (e.g., a circuit board configured to utilize up to four transceiver modules but having only two transceiver modules attached to the circuit board would use only two module cages, one for each transceiver module). Such a configuration minimizes the cost of the circuit board by eliminating attachment of unused module cages from the circuit board.

Figure 1:
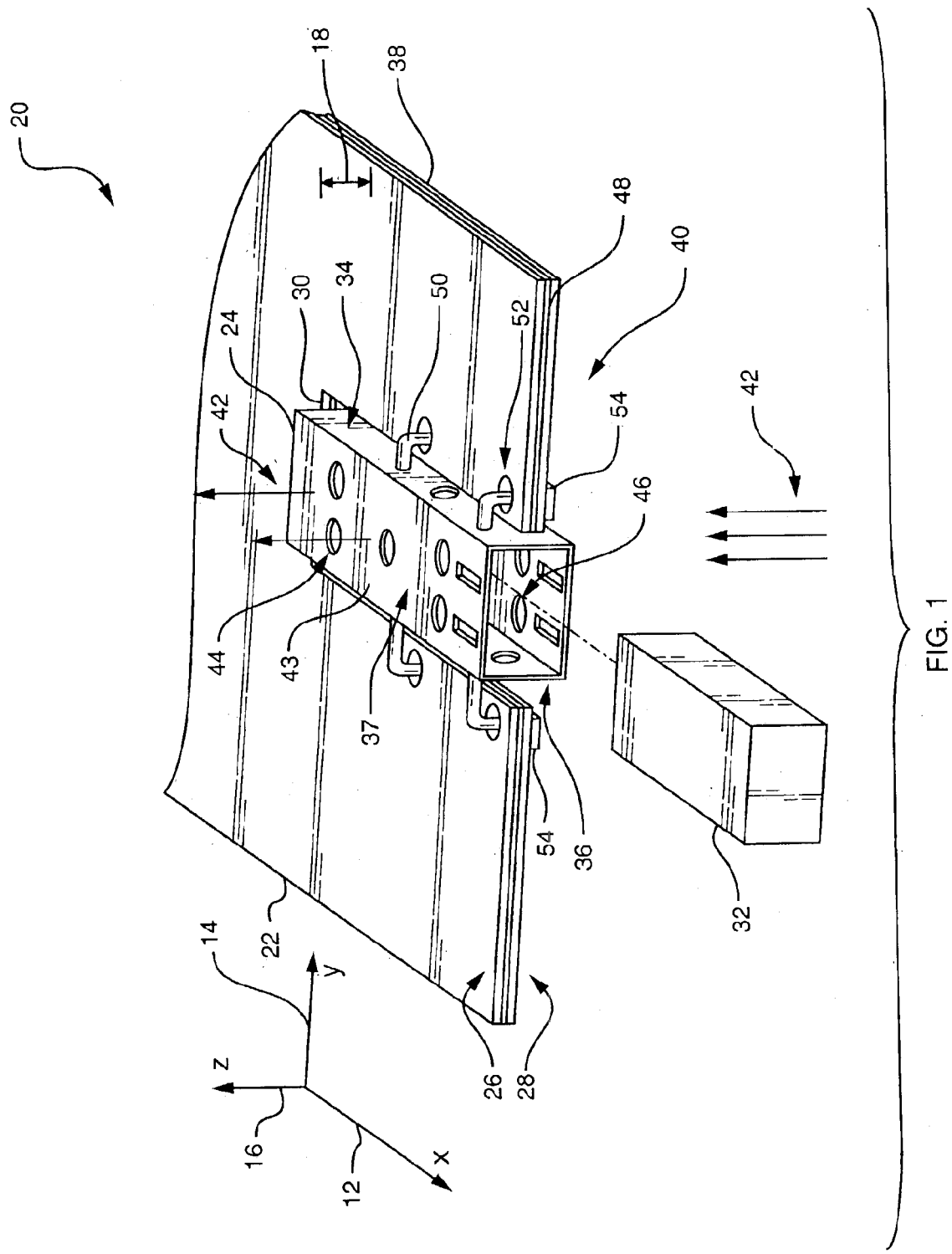
FIG. 1 is a perspective view of a circuit board assembly having a module cage, according to one embodiment.

FIG. 1 illustrates an arrangement of a circuit board assembly 20 having a circuit board 22 and a module cage or shielding cage 24.

The circuit board 22, defines a first surface 26, a second surface 28 opposing the first surface 26, and a boundary or edge 38. For example,.as shown, the boundary 38 is a rectangular shaped boundary and allows insertion of the circuit board 22 into a computer system (e.g., into a slot of a card cage). The circuit board 22 further defines a slot 30 along a portion 40 of the boundary 38. The slot 30, for example, is shaped to receive a transceiver module 32 (e.g., a rectangular slot, shaped to receive a rectangular transceiver module 32) for connection to the circuit board 22.

The module cage 24, in one arrangement, is formed from an EMI radiation blocking material, such as a tin-plated beryllium copper material. The module cage 24 attaches to the circuit board 22 and positions within the slot 30 defined by the circuit board 22.

The module cage 24 positions within the slot 30 such that a first housing portion 34 of the module cage 24 extends above or past the first surface 26 of the circuit board 22 and a second housing portion 36 of the module cage 24 is either coplanar with the second surface 28 of the circuit board 22 or extends below or past the second surface 28 of the circuit board 22 (e.g., the module cage 24 is located within the plane of the circuit board 22). Such positioning reduces the height 18 of the module cage 24 relative to the first surface 26 of the circuit board 22, as compared to conventional module cage and circuit board mounting configurations, thereby allowing positioning of the circuit board 22 into a relatively narrow vertical spacing (e.g., allowing closer proximity among adjacent circuit board assemblies 20 within a computer system). For example, the circuit board assembly 20 has a lower profile (e.g., height 18 from the first surface 26 of the circuit board 22 to a top surface 37 of the module cage 24) along a z-axis 16 direction, compared to the profile of conventional circuit board assemblies having module cages contacting (e.g., placed onto) a first surface of the circuit board.

The module cage 24 allows attachment and electronic coupling of a transceiver module 32 to the circuit board 22. The module cage 24 also acts as an alignment guide during connection of the transceiver module 32 to the circuit board 22. During assembly, for example, a user inserts the transceiver module 32, such as a pluggable transceiver module, into the module cage 24 and electrically couples the module 32 to the circuit board 22. The module cage 24 surrounds the transceiver module 32 (e.g., forms a Faraday cage about the transceiver module 32), thereby minimizing the effect of EMI radiation, transmitted from an external source (e.g., a computerized device) on the operation of the transceiver module 32. The module cage 24, therefore, isolates EMI radiation exposure of a corresponding transceiver module 32 at the module level (e.g., a single module cage 24 isolates a single transceiver module 32).

In order to provide EMI radiation protection to the transceiver module 32, the module cage 24 couples to an electrical ground. The electrical ground directs EMI radiation received by the module cage 24 away from the transceiver module 32. In one arrangement, circuit board 22 has a conductive ground plane 48, formed as part of the circuit board 22. The module cage 24 attaches or electrically couples to the ground plane 48 to dissipate EMI radiation, received from a radiation source, away from the associated transceiver module.

In one arrangement, module cage 24 couples to the ground plane 48 of the circuit board 22 by way of connection pins 50 defined by the module cage 24 and plated through holes or vias 52 defined by circuit board 22. The connection pins 50 are formed of electrically conductive material, such as a tin-plated beryllium copper. The plated through holes 52, defined by the circuit board 22, extend from the first surface 26 of the circuit board 22 to the second surface 28 of the circuit board 22. The plated through holes 52 have an electrically conductive coating, such as a metallic plating, that electrically contacts a portion of the ground plane 48 of the circuit board 22. Such a coupling forms a robust and reliable connection between the module cage 24 and the ground plane 48.

During manufacturing of the circuit board assembly 20, an assembler (e.g., a user or manufacturer forming the circuit board assembly 20) inserts the connection pins 50 of the module cage 24 into corresponding plated through holes 52 defined by the circuit board 22. In such an insertion procedure, the connection pins 50 contact the electrically conductive coating (e.g., plating) of the plated through holes 52, thereby forming an electrical connection or communication between the module cage 24 and the ground plane 48 of the circuit board 22. In such an arrangement, during operation, the module cage 24 directs EMI radiation received from a radiation source to the ground plane 48 of the circuit board 22 and away from a transceiver module 32, thereby minimizing EMI radiation interference with the operation of the transceiver module 32.

In one arrangement, the circuit board assembly 20 has electrical fasteners 54 that couples, or fastens, the connection pins 50 to the plated through holes 52, thereby forming an electrical connection between the module cage 24 and the ground plane 48 of the circuit board 22. In one arrangement, electrical fasteners 54 are formed of a solder material that create a solder joint between the connection pins 50 and plated through holes 52. For example, after the manufacturer inserts the connection pins 50 into the plated through holes 52, the manufacturer applies solder to the circuit board 22 at the juncture between the connection pins 50 and the plated through holes 52. In one arrangement, such soldering is performed along the second surface 28 of the circuit board 22. The soldering process creates an electrical contact between the connection pins 50 and grounding plane 48 via the plated through holes 52, thereby providing grounding to the module cage 24. Use of the soldering process (e.g., reflow soldering, wave soldering, etc.) to attach the module cage 24 to the ground plane 48 of the circuit board 22 minimizes manufacturing costs of the circuit board 22 in that the soldering process used for mounting circuit board components to the circuit board 22 can also be used to attach the module cage 24 to the ground plane 48 of the circuit board 22 (e.g., a single soldering process is used to coupling circuit board components and shielding components). Furthermore, the electrical fasteners secure the module cage 24 to the circuit board 22 to maintain the positioning and orientation of the module cage 24 relative to the slot 30 defined by the circuit board, the first surface 26 of the circuit board 22, and the second surface 28 of the circuit board 22.

During operation of the of the transceiver module 32, the module 32 generates heat. In one arrangement, the module cage 24 defines ventilation openings 43 to allow transmission of heat away from the transceiver module 32. As illustrated in FIG. 1, the module cage 24 defines a first ventilation opening 44 in the first housing portion 34 of the module cage 24. The module cage 24 further defines a second ventilation opening 46 in the second housing portion 36 of module cage 24. The first ventilation opening 44 and the second ventilation opening 46 allow airflow 42 to travel across the transceiver module 32 and through the module cage 24 in a direction substantially perpendicular to the first surface 26 and the second surface 28 of the circuit board 22. Positioning of the module cage 24 relative to the circuit board 22 (e.g., such that the first housing portion 34 extends above the circuit board first surface 26 and the second housing portion 36 extends below the second surface 28 of the circuit board 22) exposes the second ventilation openings 46 to the airflow 42 and increases the airflow 42 across the transceiver module 32, relative to conventional transceiver modules mounted to the surface of a host circuit board. Such exposure reduces the temperature of the transceiver module 32 housed within the module cage 24 by approximately 5–10° C., for example.

As shown in FIG. 1, the slot 30 defined by the circuit board 22 is configured to receive a single transceiver module 32 and a single module cage 24. Certain computer systems or circuit boards 22, however, require or utilize more than one transceiver module 32 during operation.

Figure 2:
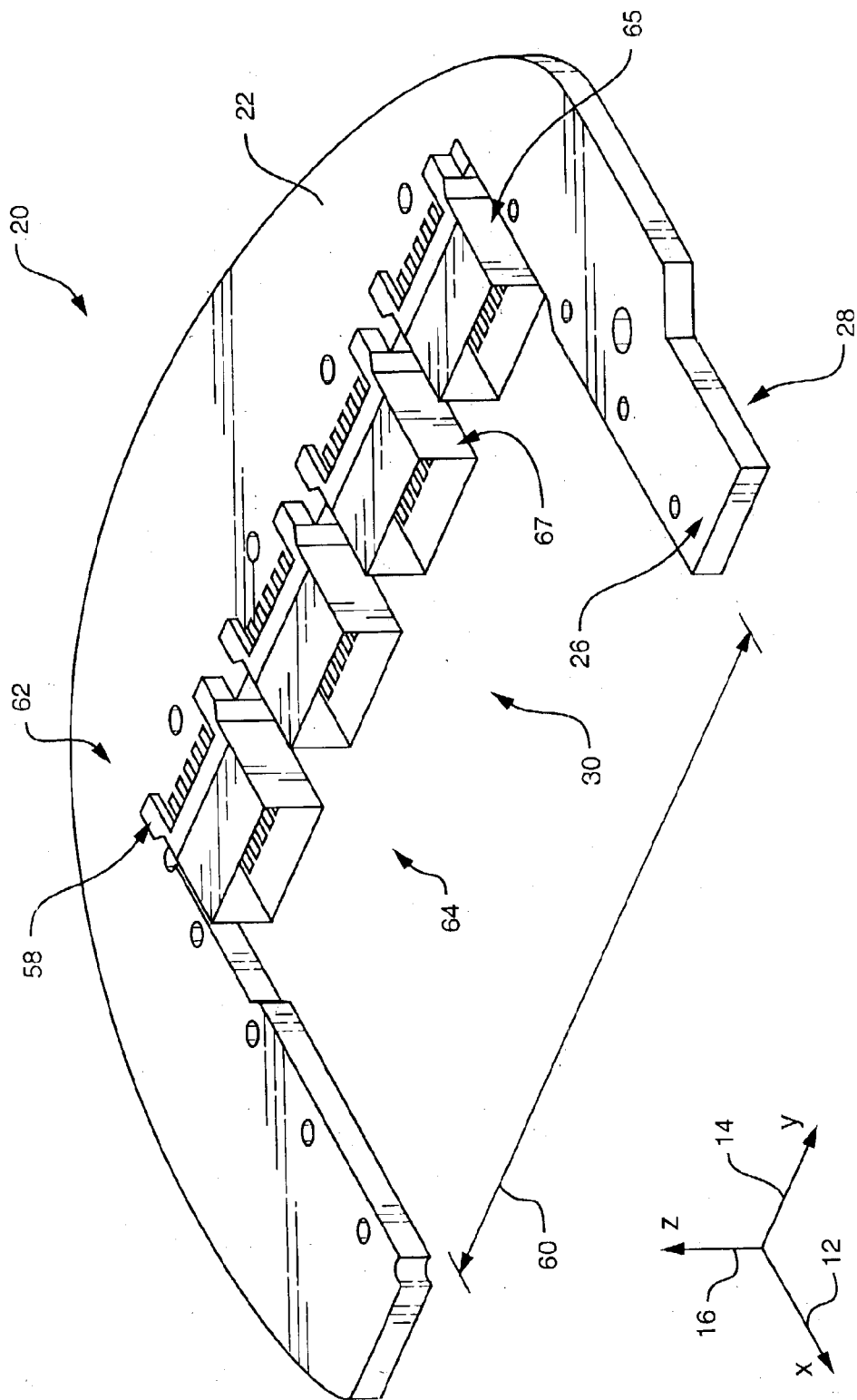
FIG. 2 illustrates a perspective view of a circuit board, according to one embodiment of the invention.
Figure 3:
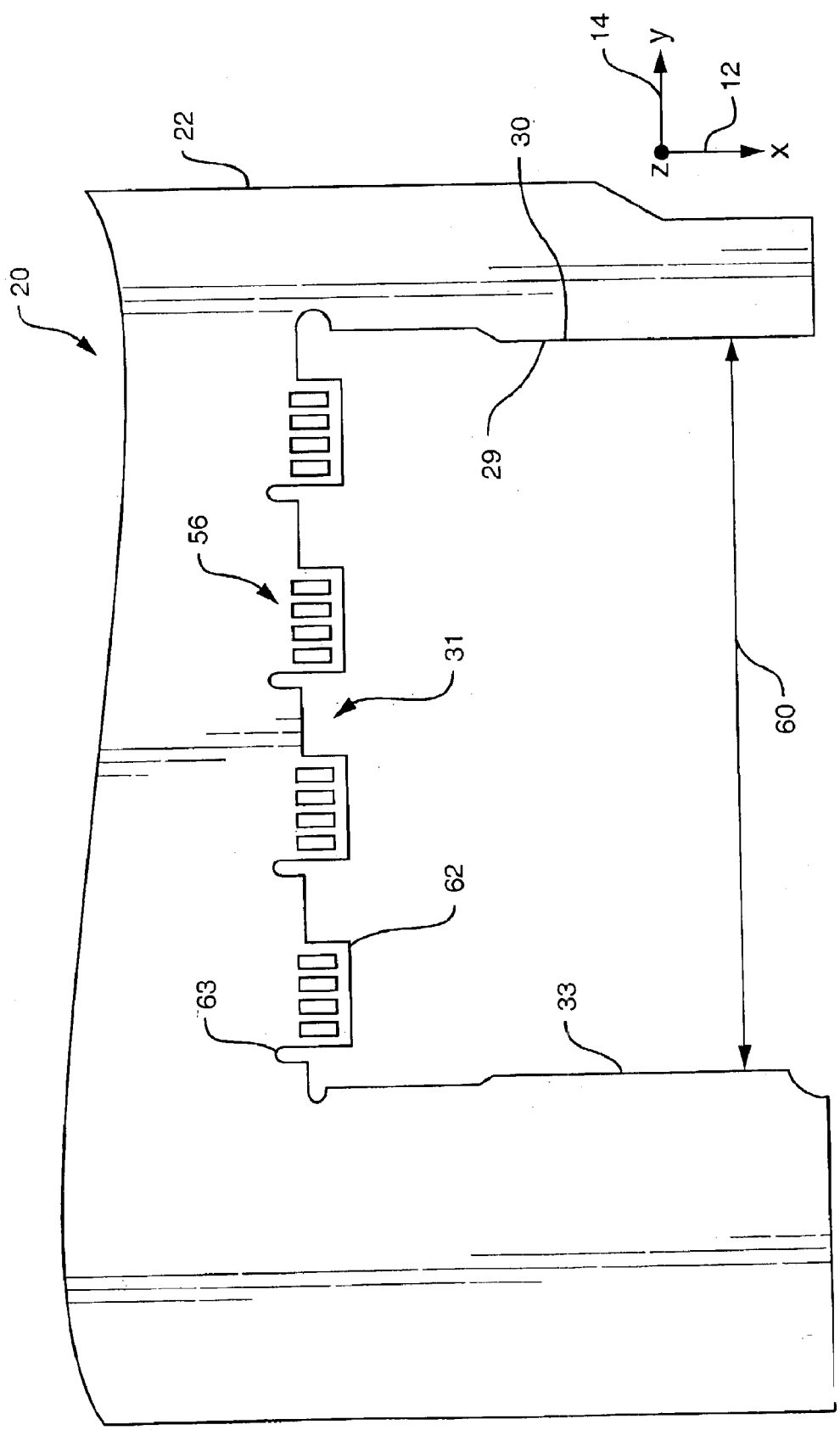
FIG. 3 illustrates a top view of a circuit board of FIG. 2, according to one embodiment of the invention.

FIGS. 2 and 3 illustrate an arrangement of the circuit board assembly 20 where the circuit board 22 is configured to receive, or couple to, multiple (e.g., two or more) transceiver modules 34 and module cages 24. FIG. 2 illustrates a perspective view of the circuit board assembly 20 and FIG. 3 illustrates a top view of the circuit board assembly 20. For example, as illustrated, the circuit board 22 defines a length 60 for the slot 30 such that the slot 30 provides connection of (e.g., is configured to accept) four individual transceiver modules 32 and four individual module cages 24, each module cage 24 corresponding to each transceiver module 32. Such a configuration provides for selective population of the circuit board 22 with module cages 24, depending upon the transceiver module requirements for a particular circuit board assembly 20 (e.g., an assembler only connects, to the circuit board 22, the number of module cages 24 that correspond to the number of transceiver modules 32 used by the circuit board 22).

For example, assume a circuit board 22 utilizes only a single transceiver module 32. In such a configuration, the circuit board 22 requires attachment of a single module cage 24. In another example, assume a circuit board 22 utilizes two transceiver modules 32. In such a configuration, the circuit board 22 requires attachment of two module cages 24, each module cage 24 corresponding to each transceiver module 32. Such selective population minimizes the number of module cages 24 used on the circuit board 22 such that the number of module cages 24 attached to the circuit board 22 corresponds to the number of transceiver modules 32 used by the circuit board 22. Selective population of the module cages, therefore, reduces the cost of manufacture and the cost of goods sold (COGS) for the circuit board 22, compared to conventional circuit board assemblies.

In one arrangement, each transceiver module 32 couples (e.g., forms an electrical connection) with the circuit board 22 through a module connector 64 and a module connector interface 62 of the circuit board 22.

FIG. 2 illustrates the circuit board 22 having module connectors 64 connected to the circuit board 22. The module connectors 64 provide a coupling interface between the transceiver modules 32 and the circuit board 22. In one arrangement, each module connector 64 has an attachment mechanism 58 that secures the module connector 64 to the circuit board 22, thereby maintaining electrical contact between the transceiver module 32 and the circuit board 22 during transceiver 32 operation. For example, the attachment mechanism 58 is configured as a mechanical latch to attach and secure the module connector 64 to the circuit board 22.

As illustrated in FIG. 3, the module connector interface 62 is integrally formed with the circuit board 22 along a rear boundary 31 of the slot 30, defined by the circuit board 22. The module connector interface 62 provides an electrical connection or contact 56 between the module connector 64 and the circuit board 22, thereby providing for electrical communication between the circuit board 22 and the transceiver module 32.

The module connector interface 62, in one arrangement, is configured for attachment of distinct or different types of module connectors 64, such as pluggable module connectors. For example, the module connector interface 62 allows connection of small form factor pluggable (SFP) connectors or 10 Gigabit small form factor pluggable (XFP) connectors.

In one arrangement, the circuit board 22 defines a recess 63 adjacent to the module connector interface 62. The recess 63 is configured to couple with the module connector 64 to limit motion or rotation of the module connector 64 within an X-Y plane (e.g., defined by the X-axis 12 and Y-axis 14) relative to the circuit board 22, such as caused by vibration of the circuit board 22. Such limitation of motion maintains electrical contact between the module connector 64 and the circuit board 22 during operation of the transceiver module 32.

In one arrangement, the module connector interface 62 is further configured to align a corresponding module connector 64 within the slot 30 relative to the circuit board 22 along the Z-axis 16. Such a configuration allows for proper orientation of the module connector 64 relative to the module connector interface 62 (e.g., alignment of the electrical connections 56 of the circuit board 22 and corresponding electrical connections of the module connector 64), thereby minimizing incorrect attachment of the module connector 64 with the module connector interface 62. As illustrated in FIG. 2, the module connector interface 62 orients the module connector 64 relative to the circuit board 22 such that a first portion 65 of the module connector 64 extends past or above the first surface 26 of the circuit board 22 and a second portion 67 of the module connector 64 extends past or below the second surface 28 of the circuit board 22. Extension of the second portion 67 of the module connector 64 below the second surface 28 of the circuit board 22, in certain arrangements, however, coincides with the second housing portion 36 the module cage 24. In such an arrangement, during attachment of the module cage 24 to the circuit board 22, the second portion 67 of the module connector 64 blocks or prevents the module cage 24 from covering or surrounding both the transceiver module 32 and the module connector 64, thereby potentially exposing a portion of the transceiver module 32 and the module connector 64 to EMI radiation.

Figure 4:
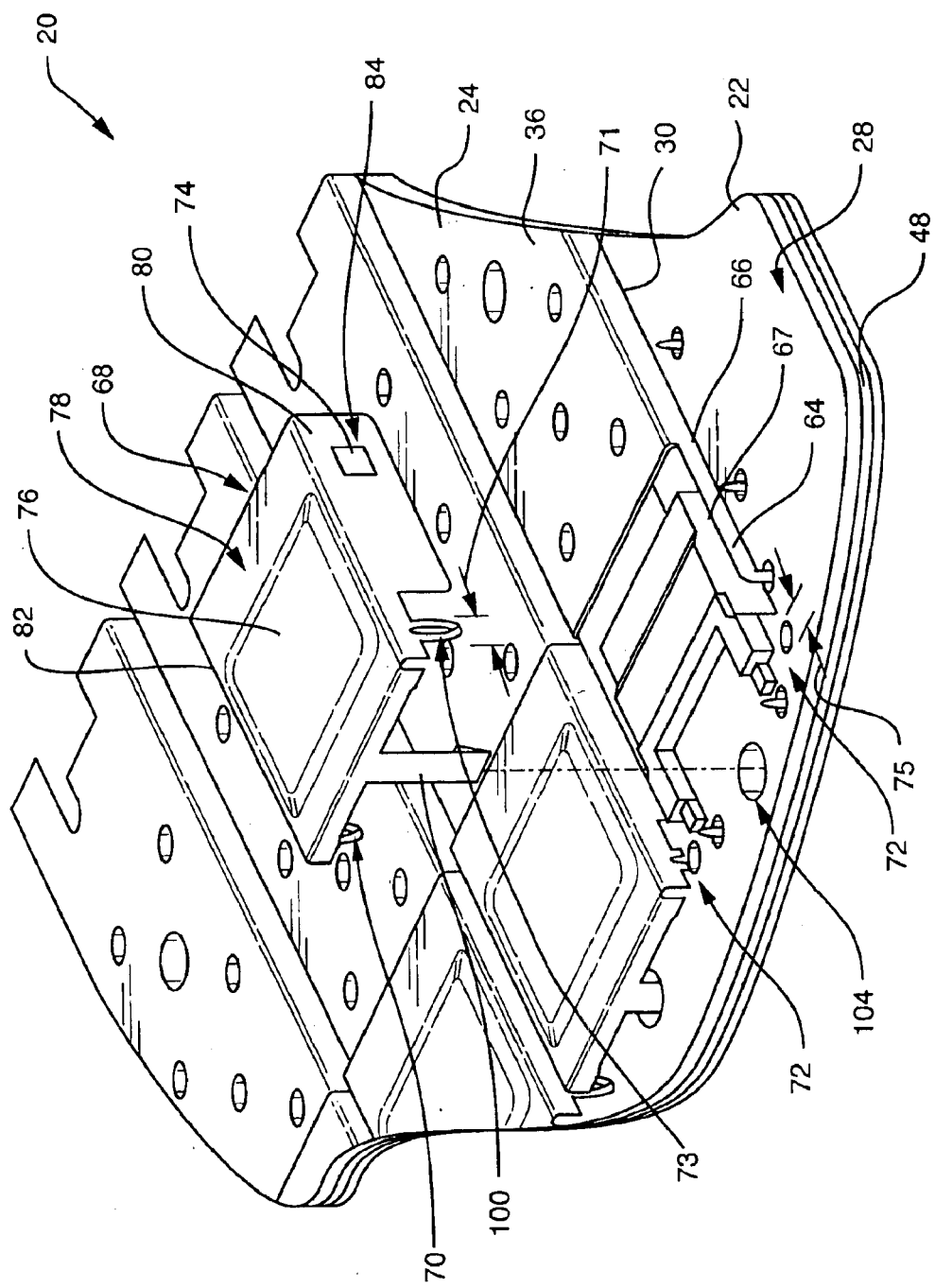
FIG. 4 illustrates the module cage of FIG. 1, according to one embodiment of the invention.

FIG. 4. illustrates an example of a module cage 24 configured to engage the circuit board 22 and maintain EMI radiation shielding about the transceiver module 32 and module connector 64 in the case where the second portion 67 of the module connector 64 extends past the second surface 28 of the circuit board 22. The module cage 24 defines a module connector opening 66, within the second housing portion 36 of the module cage 24, to engage the module connector 64. Without a module connector opening 66, in such an arrangement, the second portion 67 of the module connector 64 contacts the second housing portion 36 of the module cage 24 during attachment of the module cage 24 to the circuit board 22. As described above, the second portion 67 of the module connector 64 blocks or prevents the module cage 24 from covering or surrounding both the transceiver module 32 and the module connector 64. The module connector opening or "cut-out" 66, therefore, allows the module cage 24 to surround both the transceiver module 32 and the module connector 64 and minimizes impingement by the module connector 64 during attachment.

In the case where the module cage 24 defines the opening 66, the module cage 24 is further configured with a module connector covering 68. The module connector covering 68 engages the module cage 24 such that the module connector covering 68 covers the module connector opening 66 and provides EMI radiation shielding to the module connector 64. For a circuit board 22 configured with multiple transceiver modules 32, each having a corresponding module cage 24, the module connector covering 68, in combination with the module cage 24, isolates EMI radiation exposure of a corresponding transceiver module 32 at the module level (e.g., a single module cage 24 and module connector covering 68 isolates a single transceiver module 32).

The module connector covering 68 is formed of an EMI radiation blocking material, such as a tin-plated beryllium copper material, for example. The module connector covering 68 has a top portion 78, a first side portion 80, and a second side portion 82 (not shown). The top portion 78 of the module connector covering 68 defines a recess 76 that minimizes contact between the module connector covering 68 and the module connector 64 after attachment of the module connector covering 68 to the module cage 24. The side portions 80, 82 of the module connector covering 68 define attachment mechanisms 84 that secure the module connector covering 68 to the module cage 24 and maintain the EMI shield radiation shielding properties of the module cage 24.

In one arrangement, the attachment mechanism 84 is an opening 74 defined by the module connector covering 68 within the first side portion 80 and second side portion 82 of the module connector covering 68. The opening 74 is configured to couple with a protrusion (not shown) of the module cage 24. Coupling of the opening 74 and the protrusion of the module cage 24 draws the first side portion 80 and second side portion 82 of the module connector covering 68 against the module cage 24, thereby forming a substantially continuous EMI radiation shield about the module connector 64 and the corresponding transceiver module 32.

In another arrangement, the attachment mechanism 84 is a ground plane connector 70. The ground plane connector 70 couples the module connector covering 68 and module cage 24 to the ground plane 28 of the circuit board 22. Such coupling allows the module connector covering 68 to direct EMI radiation, received by the module cage 24, away from the transceiver module. The ground plane connector 70 furthermore, secures the module connector covering 68 to the circuit board 22.

For example, the circuit board 22 defines plated through holes or vias 72 that correspond to the ground plane connectors 70. The plated through holes 72 extend from the second surface 28 of the circuit board 22 to the first surface 26 of the circuit board 22 and are coated with electrically conductive material, such as a metallic plating, that contacts ground plane 48 of the circuit board 22. During attachment of the module connector covering 68 to the circuit board 22, the ground plane connectors 70 of the module connector covering 68 engage the plated through holes 72 defined by the circuit board 22. Such engagement creates an electrical connection between the ground plane connectors 70 and the plated through holes 72 and also forms an electrical connection between the module cage 24 and the ground plane 48.

In one arrangement, the ground plane connector 70 is configured as an eyelet connector 73 defining a width 71. In such an arrangement, the width 71 of the eyelet connector 73 is greater than a diameter 75 of each plated through hole 72. Therefore, engagement of the eyelet connector 73 with the corresponding plated through hole 72 compresses the eyelet connector 73 and creates a friction or interference fit between each eyelet connector 73 and corresponding plated through hole 72. Such a configuration allows the module connector covering 68 to be installed by manufacturer by hand (e.g., without the necessity for manufacturing equipment to couple the module connector covering 68 to the circuit board 22), thereby reducing manufacturing costs required to assemble the circuit board 22. Such a configuration also allows the module connector covering 68 to be removed or replaced during a reworking of the circuit board assembly 22.

Figure 5:
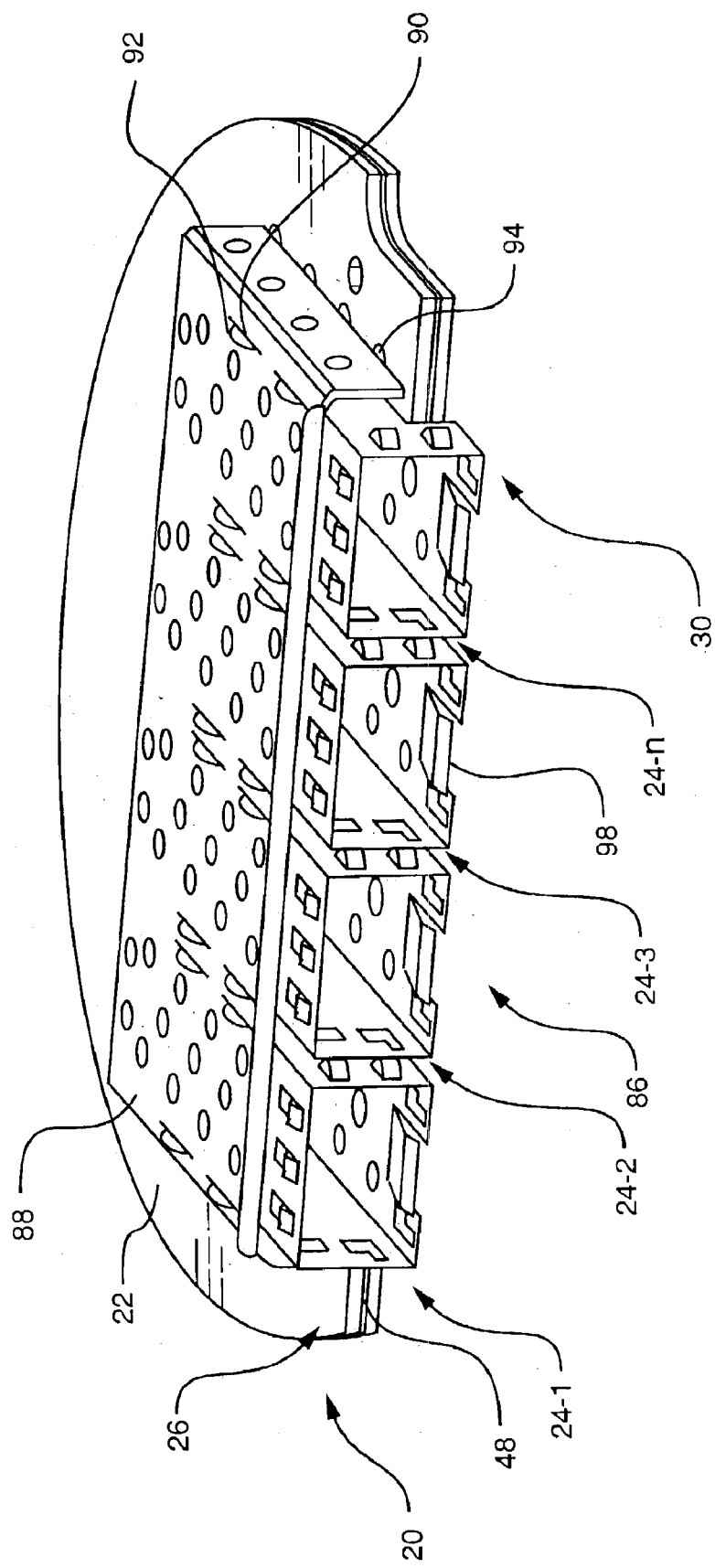
FIG. 5 illustrates a top view of the circuit board assembly of FIG. 1, according to another embodiment of the invention.
Figure 6:
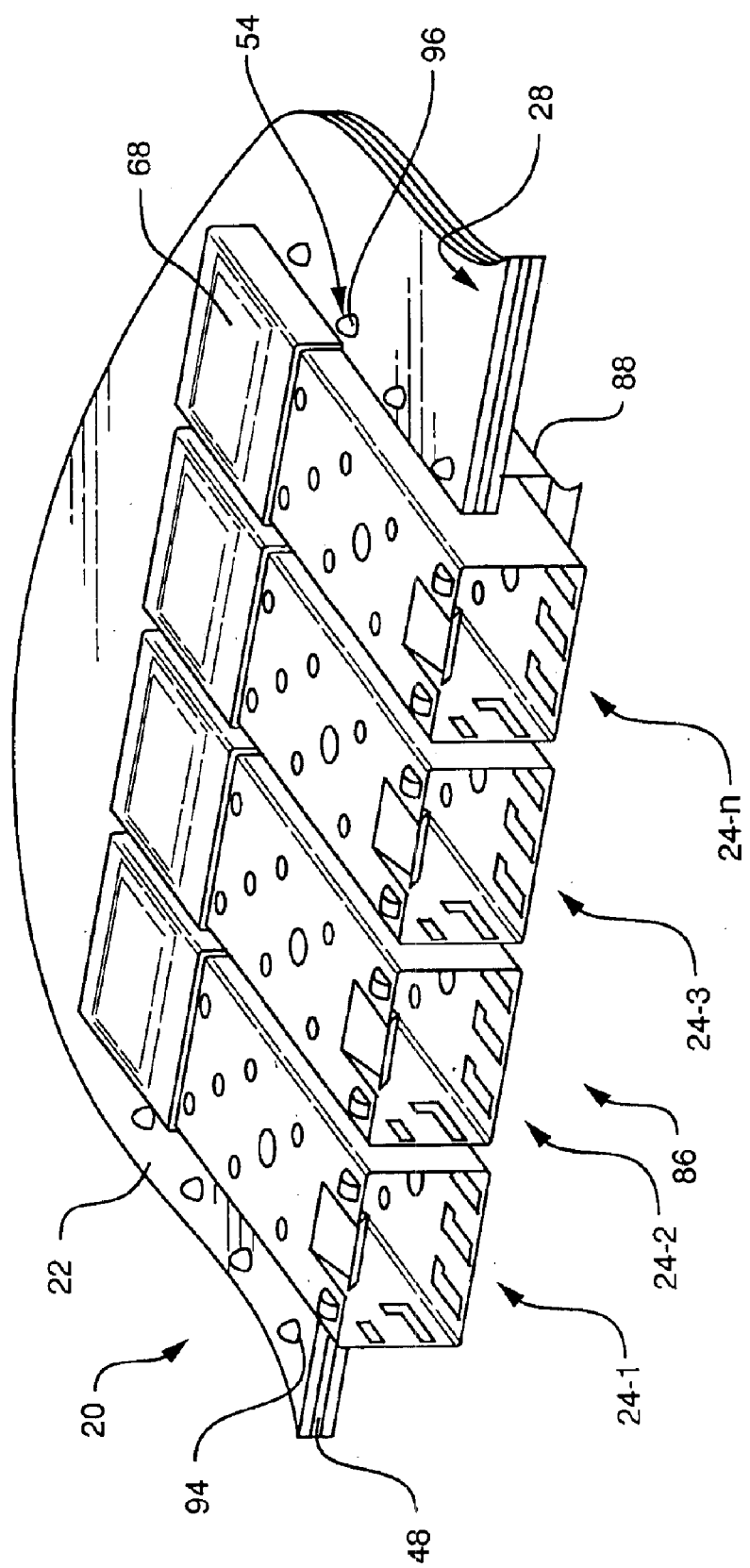
FIG. 6 illustrates a bottom view of the circuit board assembly of FIG. 1, according to one embodiment of the invention.

FIGS. 5 and 6 illustrate another arrangement for attaching a module cage 24 to the circuit board 22. In such an arrangement, circuit board assembly 20 includes a module cage carrier 88 configured to position the module cage 24 within the slot 30 defined by the circuit board 22 (e.g., the module cage carrier 88 suspends the module cage 24 within the slot 30 of the circuit board 22). The module cage carrier 88 maintains the orientation of the module cage 24 with respect to the circuit board 22 such that the first portion 34 of the module cage 24 extends past the first surface 26 of the circuit board 22 and the second portion 36 of the module cage 24 extends past the second surface 28 of the circuit board 22. By maintaining the described orientation of the module cage 24 relative to the circuit board 22, the module cage carrier 88 aids in reducing the height 18 of the circuit board 22, compared to conventional circuit board assemblies, thereby allowing positioning of the circuit board 22 into a relatively narrow vertical spacing (.g., allowing closer proximity among adjacent circuit board assemblies 20 within a computer system).

The module cage carrier 88 and the module cage 24 form a module cage assembly 86 and arc configured to provide electromagnetic interference shielding for a transceiver module 32. In one arrangement, the module cage carrier 88 is formed of a conductive material such as cold-rolled steel, for example, and has a circuit board attachment mechanism or connection pins 96 that secure the module cage carrier 88 to the circuit board 22 and forms an electrical connection between the module cage carrier 88, the module cage 24 and the ground plane 48 of the circuit board 22.

In one arrangement, the circuit board 22 defines plated through holes or vias 94 that extend from the first surface 26 of the circuit board 22 to the second surface 28 of the circuit board 22. The plated through holes 94 have an electrically conductive coating, such as a metallic plating, that contact a portion of the ground plane 48 of the circuit board 22. The circuit board attachment mechanism 96 of the module cage carrier 88 contact the plated portion of the plated through holes 94, thereby forming an electrical connection or communication between the module cage carrier 88, module cage 24 and the ground plane 48 of the circuit board 22. In such a configuration, the module cage 24 directs received EMI radiation to the ground plane 48 through the module cage carrier 88.

In one arrangement, each of the circuit board attachment mechanism 96 of the module cage carrier 88 is press fit (e.g., friction or interference fit) into each plated through hole 94 of the circuit board 22. For example, the diameter of each plated through hole 94 is smaller than the width of each circuit board attachment mechanism 96.

Coupling of the circuit board attachment mechanism 96 with the corresponding plated through holes 94 creates a friction fit between the attachment mechanism 96 and the plated through holes 94. Such a press fit or friction fit between the module cage carrier 88 and the circuit board 22 allows a user or manufacturer to visually inspect the connection or electrical coupling between the circuit board attachment mechanism 96 and the corresponding plated through holes 94 prior to attaching a module cage 24 to the carrier 88.

In one arrangement, the circuit board attachment mechanism 96 of the module cage carrier 88 secures to plated through holes 94 located along a first border 29, second (e.g., or rear) boarder 31, and a third border 33 of the slot 30. Location of such plated through holes 94 along the borders 29, 31, 33 of the slot 30 minimizes the circuit board real estate used when attaching the module cage carrier 88 to the circuit board 22 and minimizes the trace length connecting the module cage carrier 88 to the ground plane 48.

In another arrangement, the circuit board assembly 20 has electrical fasteners 54 that couples or fastens the circuit board attachment mechanisms or connection pins 96 to the plated through holes 94. In one arrangement, electrical fasteners 54 are formed of a solder material. For example, after the manufacturer inserts the connection pins 96 into the plated through holes 94, the manufacturer applies solder to the circuit board 22 at the juncture between the connection pins 96 and the plated through holes 94. The soldering process provides electrical contact between the connection pins 96 and grounding plane 48 via the plated through holes 94 thereby providing grounding to the module cage 24 attached (e.g., and electrically coupled) to the module cage carrier 88.

Figure 7:
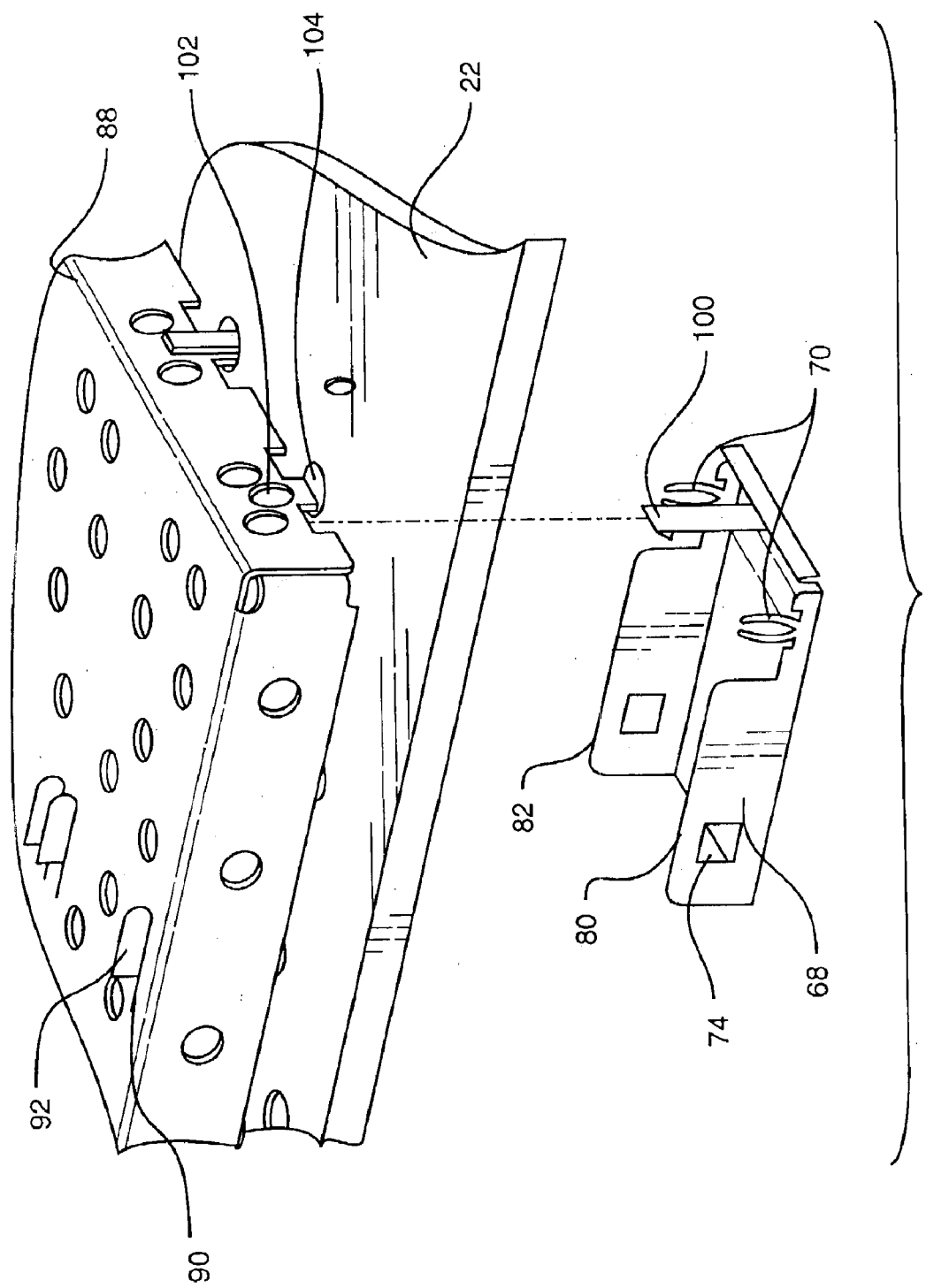
FIG. 7 illustrates the module cage of FIG. 4, according to another embodiment of the invention.

The module cage carrier 88, in one arrangement, has a cage attachment mechanism 90 that provides removable (e.g., modular) coupling of multiple module cages 24 to the circuit board 22. As shown in FIGS. 5 and 7, for example, the cage attachment mechanism 90 is defined as an opening within the module cage carrier 88 that corresponds with a connection protrusion 92 defined by, and associated with, the module cage 24. During assembly, a user inserts the connection protrusion 92 of the module cage 24 into the opening 90 within the module cage carrier 88. The user then slides the module cage 24, relative to the module cage carrier 88, toward the rear boundary 31 of the slot in the circuit board 22. Such sliding motion causes the connection protrusion to contact the module cage carrier, thereby securing the module cage 24 to the module cage carrier 88 and creating an electrical connection between the module cage 24 and the module cage carrier 88.

The module cage carrier 88 allows for attachment of multiple module cages 24 to the circuit board 22. The module cage carrier 88 maintains a pitch or distance (e.g., a minimum pitch according to Multi-Source Agreement (MSA) specifications) between adjacent module cages 24.

The module cage carrier 88 provides selective population of the circuit board 22 with module cages 24 such that the number of module cages 24 attached to the circuit board 22 coincides with the number of transceiver modules 32 required by the circuit board 22. For example, assume the circuit board 22 is configured with a slot 30 allowing for attachment of four separate transceiver modules 32 to the circuit board 22 (e.g., such as the slot 30 illustrated in FIGS. 2 and 3). Also assume that the circuit board 22 is configured to utilize two transceiver modules 32. In such a configuration, the circuit board 22 requires attachment of two module cages 24, each module cage 24 corresponding to each required transceiver module 32. The module cage carrier 88, as illustrated in FIGS. 5 and 6, provides for modular attachment of up to four module cages (e.g., module cages 24-1, 24-2, 24-3, 24-N). Therefore, during an assembly process, a user selectively populates the module cage carrier 88 with two module cages 24 corresponding to the two transceiver modules 32 used by the circuit board 22.

Such selective population of the module cages, therefore, reduces the cost of manufacture and the COGS for the circuit board 22, compared to conventional circuit board assemblies. Such a material is typically less expensive than tin-plated beryllium copper module cages 24.

FIG. 7 illustrates another arrangement of the module connector covering 68, shown in FIG. 4, configured to engage the module cage carrier 88. In such an arrangement, the module connector defines a connector covering tab 100 configured to engage a tab receptacle 102 defined by the module cage carrier 88. During assembly, user inserts the module covering tab 100 into an opening 104 defined by the circuit board 22. The user engages the module covering tab 100 with the tab receptacle 102 of the module cage carrier 88. Such engagement aids in securing the module connector covering 68 to the circuit board 22 and to the module cage carrier 88.

Also as described above, the circuit board assembly 20 forms part of a computer system. In one arrangement, multiple circuit board assemblies insert within a frame 113 of the computer system. In such an arrangement, each circuit board assembly 20 has an associated support mount that guides the circuit board assembly 20 along the frame 113 and into the computer system and aids in engaging the circuit board assembly with a backplane associated with the computer system.

Figure 8:
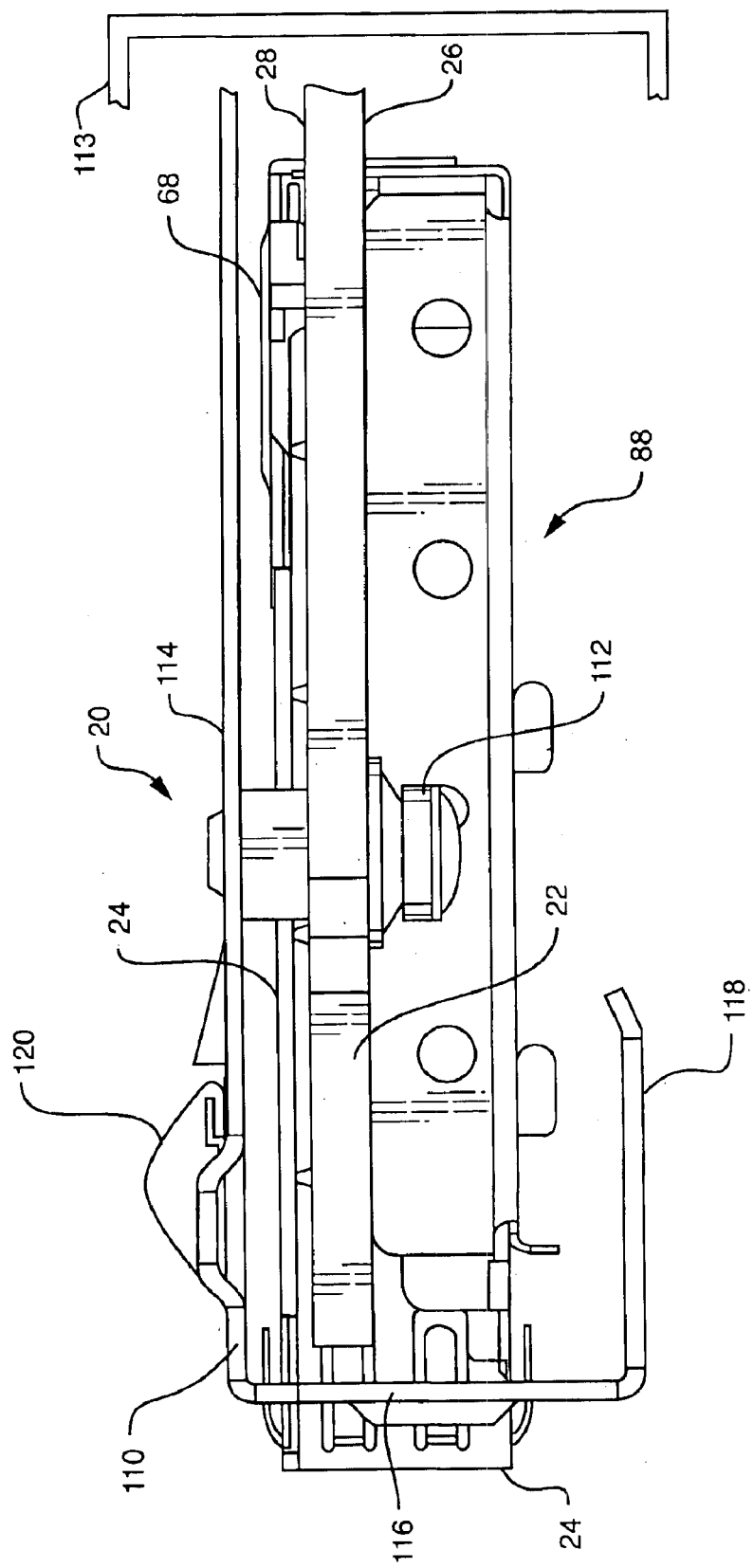
FIG. 8 illustrates a side view of a circuit board assembly, according to one embodiment of the invention.

FIG. 8 illustrates a circuit board assembly 20 having the circuit board 22 coupled 112 to a support mount 110. In one arrangement, the support mount 110 provides additional EMI radiation shielding to the transceiver modules 32 connected to the circuit board 22 along with providing shielding to the circuit board 22 as a whole. The support mount 110, in one arrangement, has a support plate 114 attached to the circuit board 22, the support plate 114 oriented substantially parallel to the second surface 28 of the circuit board 22 and having a first EMI shielding connection 120. The support mount 110 also has a face plate 116 in communication with the support plate 114 and a second EMI shielding connection 118 in communication with the face plate and oriented substantially parallel to the first surface 26 of the circuit board 22.

The support plate 114 maintains positioning of the circuit board 22 within a frame of a computer system 20. The first EMI shielding connection 120, in one arrangement, is formed of a beryllium-copper material and is configured to contact either an adjacent support mount 110 (e.g., a second EMI shielding connection 118 associated with an adjacent support mount 110) or an electric ground in order to dissipate or transfer EMI radiation away from the circuit board 22. The face plate 116 is configured to engage the module cage 24 and provide access to the transceiver module 32 coupled to the circuit board 22. The second EMI shielding connection 118, in one arrangement, is formed of a beryllium-copper material and is configured to contact either an adjacent support mount 110 (e.g., a first EMI shielding connection 120 associated with an adjacent support mount 110) or an electric ground in order to dissipate or transfer EMI radiation away from the circuit board 22.

Figure 9:
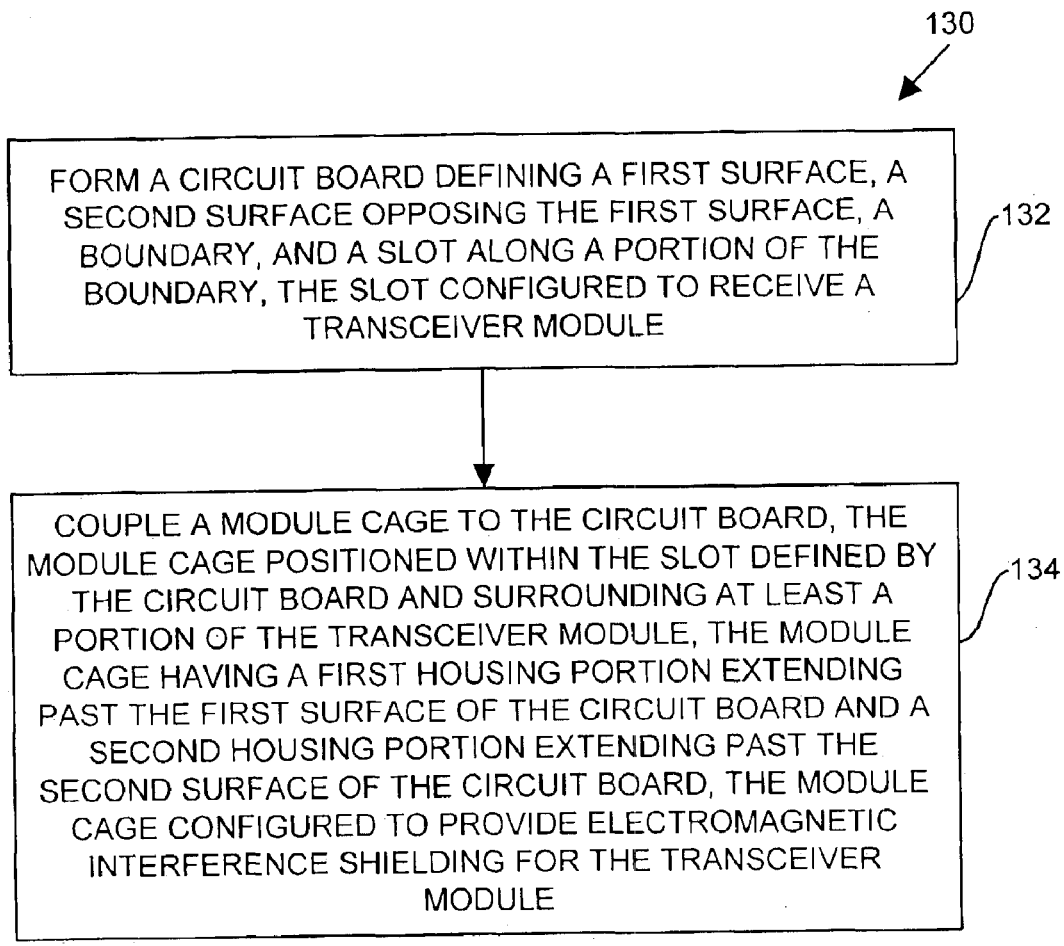
FIG. 9 is a flow chart showing a method for assembling a circuit board assembly, according to one embodiment of the invention.
Figure 10:
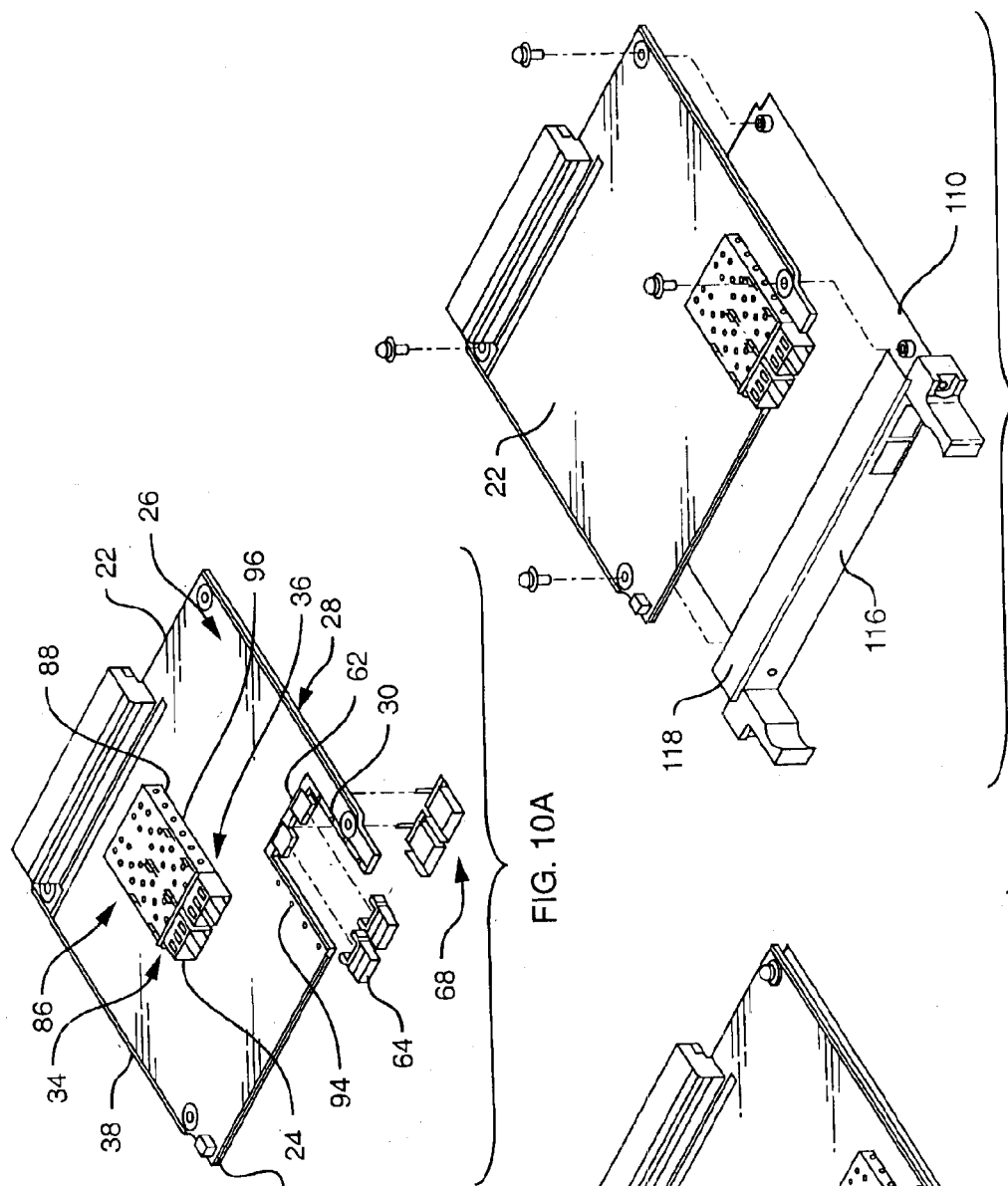
FIG. 10A illustrates an exploded view of a circuit board assembly, according to one embodiment of the invention.
FIG. 10B illustrates an exploded view of a circuit board assembly, according to one embodiment of the invention.
FIG. 10C illustrates an assembled view of a circuit board assembly, according to one embodiment of the invention.

FIG. 9 illustrates a method 130 for assembling a circuit board assembly 20, according to one embodiment of the invention. FIGS. 10A through 10C, taken concurrently with FIG. 9, provide a schematic representation of the assembly method.

In step 132, a user forms a circuit board 22 defining a first surface 26, a second surface 28 opposing the first surface 26, a boundary 38, and a slot 30 along a portion of the boundary 38 where the slot 30 is configured to receive a transceiver module 32.

In step 134, the user couples a module cage 24 to the circuit board 22, the module cage 24 positioned within the slot 30 defined by the circuit board 22 and surrounding at least a portion of the transceiver module 32, the module cage 24 having a first housing portion 34 extending past the first surface 26 of the circuit board 22 and a second housing portion 36 extending past the second surface 28 of the circuit board 22, the module cage 24 configured to provide EMI shielding for the transceiver module 32.

In one arrangement, the user couples the module cage 24 to the circuit board 33 where the module cage 24 defines ventilation openings 44, 46. The ventilation openings 44, 46 allow air to flow through the module cage 24 and across the transceiver module 32, in a direction substantially perpendicular to the first surface 26 and second surface 28 of the circuit board 22. Such ventilation allows for cooling of the transceiver module 32.

In one arrangement, the user couples the module cage 32 to a module cage carrier 88 and couples the module cage carrier 88 to the circuit board 22. The module cage carrier 88 is configured to position the module cage 24 within the slot 30 defined by the circuit board 22 such that the first portion 34 of the module cage 24 extends past the first surface 26 of the circuit board 22 and the second portion 36 of the module cage 24 extends past the second surface 28 of the circuit board 28. The module cage carrier 88 and the module cage 24 are configured to provide EMI shielding for the transceiver module 32.

In one arrangement, the user forms the circuit board 22 with a conductive ground-plane 48 and a plated through hole 94 that extends from the first surface 26 to the second surface 28 of the circuit board 22, the plated through hole 94 being in electrical communication with the conductive ground plane 48. The user fastens a connection pin 96 defined by the module cage carrier 88 to the plated through hole 94 to couple the module cage carrier 88 to the circuit board 22.

In one arrangement, the user couples a module connector 64 to the circuit board 22, the module connector 64 aligned with the slot 30 defined by the circuit board 22. In one arrangement, the user performs such coupling prior to coupling the module cage 24 to the circuit board 22. The user engages the module connector 64 with a module connector opening 66 defined by the second housing portion 36 of the module cage 24. The user attaches a module connector covering 68 to the module cage 24 to cover the module connector opening 66. The user engages the module connector covering 68 with the module cage carrier 88, wherein the module cage 24, module connector covering 68, and module cage carrier 88 are configured to provide EMI shielding for the transceiver module 32.

In one arrangement, the user couples a support mount 110 to the circuit board 22. The support mount 110 has a support plate 114 attached to the circuit board 22 and oriented substantially parallel to the second surface 28 of the circuit board 28, the support plate 114 having a first EMI shielding connection 120, a face plate 116 in communication with the support plate 114, the face plate 116 configured to engage the module cage 24 and provide access to the transceiver module 32, and a second EMI shielding connection 118 in communication with the face plate 116 and oriented substantially parallel to the first surface 26 of the circuit board 22.

During operation, the transceiver module 32 generates heat. For example, XFP modules have a power dissipation of up to 5 watts. The use of multiple transceiver modules 32 within a circuit board assembly 20, therefore, produces a relatively large amount of heat.

Figure 11:
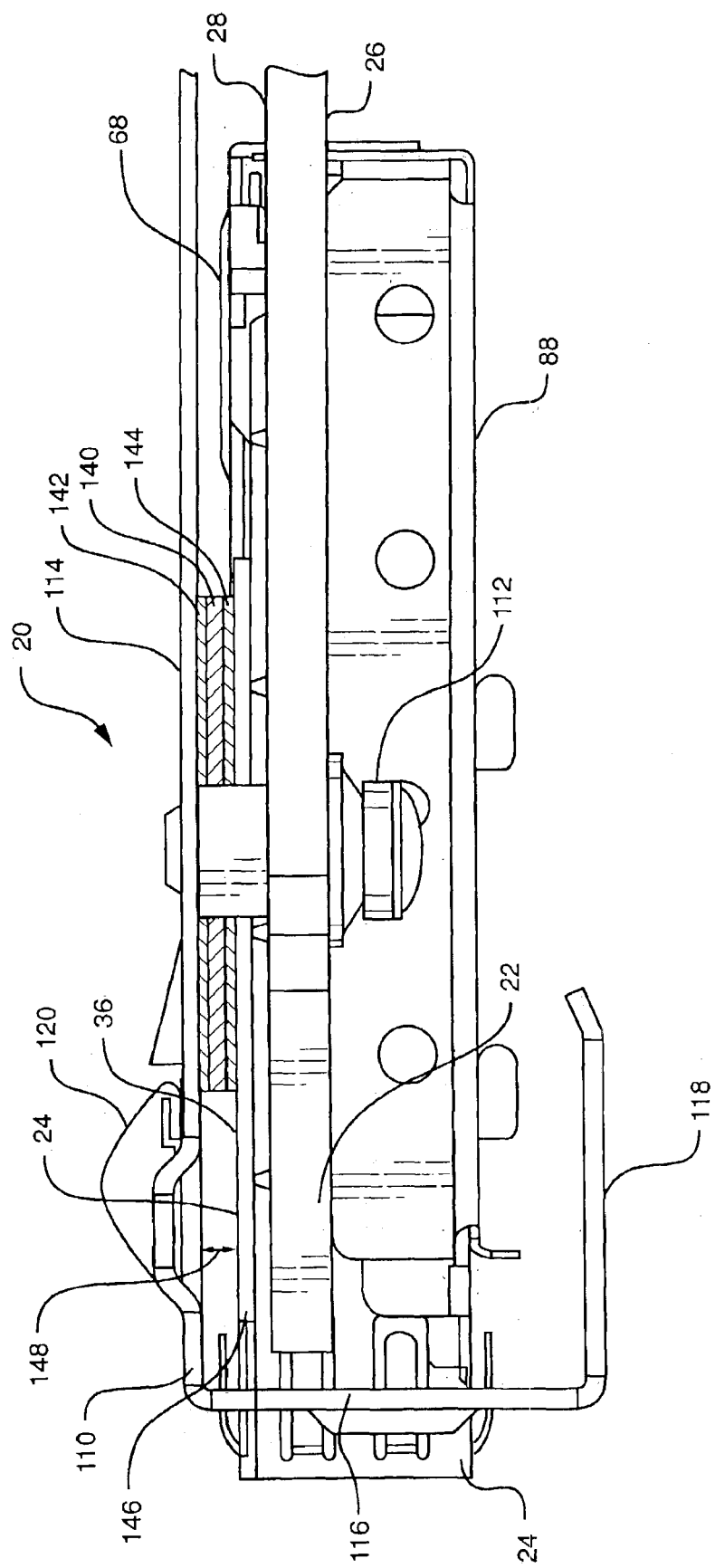
FIG. 11 illustrates a side view of a circuit board assembly, according to another embodiment of the invention.

FIG. 11 illustrates a circuit board assembly 20 having the circuit board 22 coupled 112 to the support mount 110 with a heat sink 140 positioned between, and in thermal contact with, the module cage 24 and the support mount 110. The heat sink 140 is formed of a thermally conductive material, such as an aluminum material or copper material, for example. The heat sink 140 transmits heat, received from the module cage 24 via the transceiver module 32, to the support mount 110. Such heat transmission aids in lowering the temperature of the transceiver module 32, thereby minimizing the risk of failure of the transceiver module 32.

In one arrangement, the heat sink 140 mounts within a space 148 defined by a second housing portion wall 146 of the module cage 24 and the support plate 114 of the support mount 110. The heat sink, in such an arrangement, 140 has thermal interface layers 142, 144 that secure the heat sink 140 to the support plate 114 and to the second housing portion wall 146, respectively. The thermal interface layers 142, 144, furthermore, provide thermal coupling between the heat sink 140 and both the support plate 114 and the second housing portion wall 146 and also decrease interface thermal resistance (e.g., such as provided by an air gap) between the heat sink 140 and the support plate 114 and between the heat sink 140 and the second housing portion wall 146. For example, the thermal interface layers 142, 144 can be thermal pads or a thermal adhesive.

In one arrangement, during operation, heat from the transceiver module 32 travels, via convection, to the module cage 24. The module cage 24, in turn, absorbs the convected heat and transfers the heat, via conduction, to the heat sink 140. In another arrangement, the transceiver module 32 contacts the module cage 24 to allow conduction of heat from the transducer module 32 to the module cage 24. For example, the transceiver module 32 contacts the second housing portion wall 146 of the module cage 24 (e.g., in a location in proximity to the location of the heat sink) to focus the heat from the transceiver module 32 to the area of the module cage 24 in closest proximity to the heat sink 140. In another arrangement, the transceiver module 32 attaches to a contact finger 98, shown in FIG. 5, in communication with the second housing portion wall 146 of the module cage 24 to focus the heat from the transceiver module 32 to the area of the module cage 24 in closest proximity to the heat sink 140. Because of the proximity of the transceiver module 32 relative to the heat sink 140, such configurations maximize the amount of heat transferred from the transceiver module 32 to the heat sink 140.

Those skilled in the art will understand that there can be many variations made to the embodiments explained above while still achieving the same objective of those embodiments and the invention in general.

As illustrated in FIG. 1, the module cage 24 defines a first ventilation opening 44 in the first housing portion 34 of the module cage 24 and a second ventilation opening 46 in the second housing portion 36 of module cage 24. Such ventilation openings 44, 46 allow airflow 42 to travel across the transceiver module 32 and through the module cage 24 in a direction substantially perpendicular to the first surface 26 and a second surface 28 of the circuit board 22. In another arrangement, the module cage 24 is configured with ventilation openings located within the side portions of the module cage 24 to allow airflow through the module cage 24 in a direction substantially parallel to the first surface 26 and the second surface 28 of the circuit board 22.

As described above, the module cage is 24 attached to the module cage carrier 88 using a cage attachment mechanism 90. As described, the cage attachment mechanism 90 involves an opening 90, defined by the module cage carrier 88, engaged by a corresponding protrusion 92, defined by the module cages 24. Such attachment allows removal of module cages 24 from the module cage carrier 88 and provides electrical contact between the module cage 24 and the module cage carrier 88. In another arrangement, the module cage 24 attaches to the module cage carrier 88 through a relatively permanent attachment mechanism, such as through a welded connection between the module cage and the module cage carrier 88. For example, in one arrangement, after the module cage protrusion 92 engages the opening 90 of the module cage carrier 88, a user welds the intersection of the protrusion 92 and the opening 90 to secure (e.g., permanently attach) the module cages 24 to the module cage carrier 88.

As described above, the circuit board assembly 20 has electrical fasteners 54 that couples, or fastens, the connection pins 50 defined by the module cage 24 to the plated through holes 52 defined by the circuit board 22. In one arrangement, electrical fasteners 54 are formed of a solder material that create a solder joint between the connection pins 50 and plated through holes 52. In another arrangement, the connection pins 50 of the module cage "press fit" into (e.g., form a friction or interference with) the plated through holes 52. For example, in such a configuration, the diameter of the plated through holes 52 is smaller than the diameter of the connection pins 50. Insertion of the connection pins 50 into the plated through holes 52, therefore, creates a friction fit between the connection pins 50 and the plated through holes 52. The "press fit" or friction fit maintains an electrical connection between the module cage 24 and the ground plane 48 of the circuit board 22 and secures the module cage 24 to the circuit board 22. Alternately, the electrical fasteners 54 include glue or mechanical hardware (e.g., nuts and bolts) to electrically attach the connection pins 50, defined by the module cage 24, to the plated through holes 52, defined by the circuit board 22.

As shown and described above, the circuit board is configured to receive one, two, or four transceiver modules 32 and module cages 24. Such configurations are by way of example only. For example, in another arrangement, the circuit board 22 is configured to receive seven separate transceiver modules 32 and module cages 24.

Such variations are intended to be covered by the scope of this invention. As such, the foregoing description of embodiments of the invention is not intended to be limiting. Rather, any limitations to the invention are presented in the following claims.

What is claimed is:

1. A circuit board assembly comprising:
   a circuit board defining a first surface, a second surface opposing the first surface, a boundary, and a slot along a portion of the boundary, the slot configured to receive a transceiver module; and
   a module cage coupled to the circuit board, the module cage positioned within the slot defined by the circuit board and surrounding at least a portion of the transceiver module, the module cage having a first housing portion extending past the first surface of the circuit board and a second housing portion extending past the second surface of the circuit board, the module cage configured to provide electromagnetic interference shielding for the transceiver module.

2. The circuit board assembly of claim 1 wherein the module cage defines a first ventilation opening in the first housing portion and a second ventilation opening in the second housing portion, the first ventilation opening and the second ventilation opening configured to allow air flow through the module cage in a direction substantially perpendicular to the first surface and second surface of the circuit board.

3. The circuit board assembly of claim 1 wherein the module cage defines at least one connection pin and wherein the circuit board defines at least one plated through hole that extends from the first surface to the second surface of the circuit board, the circuit board comprising:
   a conductive ground-plane, the plated through hole being in electrical communication with the conductive ground plane; and
   an electrical fastener that fastens the at least one connection pin of the module cage to the at least one plated through hole to couple the module cage to the circuit board.

4. The circuit board assembly of claim 1 further comprising a module connector electrically coupled to the circuit board and aligned with the slot defined by the circuit board and wherein:
   the second housing portion of the module cage defines a module connector opening configured to engage the module connector; and
   the module cage further comprises a module connector covering configured to attach to the module cage to cover the module connector opening, wherein the module cage and module connector covering are configured to provide electromagnetic interference shielding for the transceiver module.

5. The circuit board assembly of claim 4 wherein the module connector comprises a small form factor pluggable (SFP) connector.

6. The circuit board assembly of claim 4 wherein the module connector comprises a 10 gigabit small form factor pluggable (XFP) connector.

7. The circuit board assembly of claim 1 further comprising a module cage carrier coupled to the circuit board and coupled to the module cage, the module cage carrier configured to position the module cage within the slot defined by the circuit board such that the first portion of the module cage extends past the first surface of the circuit board and the second portion of the module cage extends past the second surface of the circuit board, the module cage carrier and the module cage configured to provide electromagnetic interference shielding for the transceiver module.

8. The circuit board assembly of claim 7 wherein the module cage carrier defines at least one connection pin and wherein the circuit board comprises:
   a conductive ground-plane;
   at least one plated through hole that extends from the first surface to the second surface of the circuit board, the plated through hole being in electrical communication with the conductive ground plane; and
   an electrical fastener that fastens the at least one connection pin of the module cage carrier to the at least one plated through hole to couple the module cage carrier to the circuit board.

9. The circuit board assembly of claim 7 wherein:
   the slot is configured to receive two or more module cages; and
   the module cage carrier is configured for attachment of two or more module cages to the module cage carrier.

10. The circuit board assembly of claim 7 further comprising a module connector electrically coupled to the circuit board and aligned with the slot defined by the circuit board and wherein:

the second housing portion of the module cage defines a module connector opening configured to engage the module connector; and the module cage further comprises a module connector covering configured to attach to the module cage to cover the module connector opening and to engage the module cage carrier, wherein the module cage, module connector covering, and module cage carrier are configured to provide electromagnetic interference shielding for the transceiver module.

11. The circuit board assembly of claim 10 wherein the module connector comprises a small form factor pluggable (SFP) connector.

12. The circuit board assembly of claim 10 wherein the module connector comprises a 10 gigabit small form factor pluggable (XFP) connector.

13. The circuit board assembly of claim 1 further comprising a support mount coupled to the circuit board, the support mount having:

a support plate attached to the circuit board and oriented substantially parallel to the second surface of the circuit board, the support plate having a first electromagnetic interference shielding connection;

a face plate in communication with the support plate, the face plate configured to engage the module cage and provide access to the transceiver module; and a second electromagnetic interference shielding connection in communication with the face plate and oriented substantially parallel to the first surface of the circuit board.

14. The circuit board assembly of claim 13 further comprising a heat sink positioned within a space defined by the support plate and a second housing portion wall of the module cage, the heat sink in thermal contact with the support plate and the second housing portion wall, the heat sink configured to transmit heat from the transceiver module to the support plate.

15. A method for assembling a circuit board assembly comprising the steps of:

forming a circuit board defining a first surface, a second surface opposing the first surface, a boundary, and a slot along a portion of the boundary, the slot configured to receive a transceiver module; and coupling a module cage to the circuit board, the module cage positioned within the slot defined by the circuit board and surrounding at least a portion of the transceiver module, the module cage having a first housing portion extending past the first surface of the circuit board and a second housing portion extending past the second surface of the circuit board, the module cage configured to provide electromagnetic interference shielding for the transceiver module.

16. The method of claim 15 wherein the step of coupling the module cage to the circuit board further comprises the step of coupling the module cage defining a first ventilation opening in the first housing portion and a second ventilation opening in the second housing portion, the first ventilation opening and the second ventilation opening configured to allow air flow through the module cage in a direction substantially perpendicular to the first surface and second surface of the circuit board.

17. The method of claim 15 wherein the step of forming further comprises forming the circuit board having a conductive ground-plane and defining at least one plated through hole that extends from the first surface to the second surface of the circuit board, the plated through hole being in electrical communication with the conductive ground plane and further comprising the step of:

fastening at least one connection pin, defined by the module cage, to the at least one plated through hole to couple the module cage to the circuit board.

18. The method of claim 15 further comprising the steps of:

coupling a module connector to the circuit board, the module connector aligned with the slot defined by the circuit board;

engaging the module connector with a module connector opening defined by the second housing portion of the module cage; and attaching a module connector covering to the module cage to cover the module connector opening the module cage and module connector covering configured to provide electromagnetic interference shielding for the transceiver module.

19. The method of claim 15 wherein the step of coupling comprises the steps of:

coupling the module cage to the module cage carrier; and coupling the module cage carrier to the circuit board, the module cage carrier configured to position the module cage within the slot defined by the circuit board such that the first portion of the module cage extends past the first surface of the circuit board and the second portion of the module cage extends past the second surface of the circuit board, the module cage carrier and the module cage configured to provide electromagnetic interference shielding for the transceiver module.

20. The method of claim 19 wherein the step of forming further comprises forming the circuit board having a conductive ground-plane and at least one plated through hole that extends from the first surface to the second surface of the circuit board, the plated through hole being in electrical communication with the conductive ground plane and further comprising the steps of:

fastening at least one connection pin defined by the module cage carrier to the at least one plated through hole to couple the module cage carrier to the circuit board.

21. The method of claim 19 further comprising the steps of:

configuring the slot, defined by the circuit board, to receive two or more module cages;

configuring the module cage carrier for attachment of two or more module cages to the module cage carrier.

22. The method of claim 19 further comprising the steps of:

coupling a module connector to the circuit board, the module connector aligned with the slot defined by the circuit board;

engaging the module connector with a module connector opening defined by the second housing portion of the module cage; and attaching a module connector covering to the module cage to cover the module connector opening; and engaging the module connector covering with the module cage carrier, wherein the module cage, module connector covering, and module cage carrier are configured to provide electromagnetic interference shielding for the transceiver module.

23. The method of claim 15 further comprising the step of coupling a support mount to the circuit board, the support mount having a support plate attached to the circuit board and oriented substantially parallel to the second surface of the circuit board, the support plate having a first electromagnetic interference shielding connection, a face plate in communication with the support plate, the face plate configured to engage the module cage and provide access to the transceiver module, and a second electromagnetic interference shielding connection in communication with the face plate and oriented substantially parallel to the first surface of the circuit board.

24. The method of claim 23 further comprising the step of positioning a heat sink within a space defined by the support plate and a second housing portion wall of the module cage, the heat sink in thermal contact with the support plate and the second housing portion wall, the heat sink configured to transmit heat from the transceiver module to the support plate.

25. A module cage assembly comprising:

a module cage; and a module cage carrier coupled to the module cage, the module cage carrier configured to position the module cage within a slot defined by a circuit board such that the first portion of the module cage extends past the first surface of the circuit board and the second portion of the module cage extends past the second surface of the circuit board, the module cage carrier and the module cage configured to provide electromagnetic interference shielding for a transceiver module.

26. The module cage assembly of claim 25 wherein the module cage defines a first ventilation opening in the first portion and a second ventilation opening in the second portion, the first ventilation opening and the second ventilation opening configured to allow air flow through the module cage in a direction substantially perpendicular to the first surface and the second surface of the circuit board.

27. The module cage assembly of claim 25 wherein the module cage carrier is configured for attachment of two or more module cages to the module cage carrier.

28. The module cage assembly of claim 25 wherein:

the second portion of the module cage defines a module connector opening configured to engage a module connector of the circuit board; and the module cage further comprises a module connector covering configured to attach to the module cage to cover the module connector opening and to engage the module cage carrier, the module cage, module connector covering, and module cage carrier configured to provide electromagnetic interference shielding for the transceiver module.

29. A computer system comprising:

a frame; and at least one circuit board assembly coupled to the frame, the circuit board assembly having:

a circuit board defining a first surface, a second surface opposing the first surface, a border, and a slot along a portion of the border, the slot configured to receive a transceiver module; and a module cage coupled to the circuit board, the module cage positioned within the slot defined by the circuit board and surrounding at least a portion of the transceiver module, the module cage having a first housing portion extending past the first surface of the circuit board and a second housing portion extending past the second surface of the circuit board, the module cage configured to provide electromagnetic interference shielding for the transceiver module.

30. The computer system of claim 29 further comprising a support mount coupled to the circuit board assembly, the support mount having:

a support plate attached to the circuit board and oriented substantially parallel to the second surface of the circuit board, the support having a first electromagnetic interference shielding connection;

a face plate in communication with the support plate, the face plate configured to engage the module cage and provide access to the transceiver module; and a second electromagnetic interference shielding connection in communication with the face plate and oriented substantially parallel to the first surface of the circuit board.

* * * * *

UNITED STATES PATENT AND TRADEMARK OFFICE
CERTIFICATE OF CORRECTION

PATENT NO.         : 6,866,544 B1
APPLICATION NO. : 10/396854
DATED                 : March 15, 2005
INVENTOR(S)       : Kevin Franklin Casey et al.

Page 1 of 1

It is certified that error appears in the above-identified patent and that said Letters Patent is hereby corrected as shown below:

Title Page

Item [75] First named Inventors should read --Kevin Franklin Casey--

Column 22, line 40 insert new claims 31 and 32 as follows:

31. The circuit board assembly of claim 1 wherein the circuit board defines:
 a module connector interface oriented within the slot defined by the circuit board, the module connector interface configured to provide an electrical connection contact between a module connector and the circuit board; and
 a recess oriented in proximity to the module connector interface, the recess configured to couple with the module connector to limit rotation of the module connector relative to the circuit board.

32. The method of claim 15 wherein the step of forming further comprises:
 forming a module connector interface within the slot defined by the circuit board, the module connector interface configured to provide an electrical connection contact between a module connector and the circuit board; and
 forming a recess in proximity to the module connector interface, the recess configured to couple with the module connector to limit rotation of the module connector relative to the circuit board.

Signed and Sealed this

Fifteenth Day of August, 2006

JON W. DUDAS
*Director of the United States Patent and Trademark Office*